United States Patent
Kishore et al.

(10) Patent No.: US 10,656,203 B1
(45) Date of Patent: May 19, 2020

(54) LOW PIN COUNT TEST CONTROLLER

(71) Applicant: QUALCOMM Incorporated, San Diego, CA (US)

(72) Inventors: Punit Kishore, Bangalore (IN); Jais Abraham, Bangalore (IN); Pawan Chhabra, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/278,420

(22) Filed: Feb. 18, 2019

(51) Int. Cl.
*G01R 31/317* (2006.01)
*G06F 13/42* (2006.01)
*G01R 31/3177* (2006.01)
*H03K 19/20* (2006.01)

(52) U.S. Cl.
CPC ... *G01R 31/31723* (2013.01); *G01R 31/3177* (2013.01); *G01R 31/31727* (2013.01); *G06F 13/4282* (2013.01); *G06F 2213/0008* (2013.01); *G06F 2213/0012* (2013.01); *G06F 2213/0042* (2013.01); *G06F 2213/3812* (2013.01); *H03K 19/20* (2013.01)

(58) Field of Classification Search
CPC ........ G01R 31/31723; G01R 31/31727; G01R 31/3177; G06F 13/4282; G06F 2213/0042; G06F 2213/3812; G06F 2213/0008; G06F 2213/0012; H03K 19/20
USPC .................... 714/731, 718, 724, 742, 43, 46
See application file for complete search history.

(56) References Cited

U.S. PATENT DOCUMENTS

| | | | | |
|---|---|---|---|---|
| 9,977,477 | B2* | 5/2018 | C. R. ................... | G06F 1/266 |
| 2004/0107303 | A1* | 6/2004 | Mulligan .............. | G06F 1/1613 710/1 |
| 2004/0153799 | A1* | 8/2004 | Maneparambil ......... | H04L 1/24 714/30 |
| 2005/0001611 | A1* | 1/2005 | Conti ............... | G01R 31/31926 324/762.02 |
| 2013/0218508 | A1* | 8/2013 | Jindal ..................... | G05B 1/00 702/120 |
| 2015/0356027 | A1* | 12/2015 | Arbel .................... | G06F 12/145 710/308 |
| 2017/0085399 | A1* | 3/2017 | Latif .................. | H04L 25/03006 |
| 2017/0123470 | A1* | 5/2017 | Srivastava .............. | G06F 1/266 |
| 2017/0269157 | A1* | 9/2017 | Mao .................... | G06F 11/2236 |

OTHER PUBLICATIONS

Song et al., Design Reuse of on/off-Chip Bus Bridge for Efficient Test Access to AMBA-based SoC, 2007, IEEE, pp. 193-198. (Year: 2007).*

* cited by examiner

*Primary Examiner* — John J Tabone, Jr.
(74) *Attorney, Agent, or Firm* — Patterson & Sheridan, L.L.P

(57) ABSTRACT

Certain aspects of the present disclosure provide an apparatus for processor core testing. The apparatus generally includes a high-speed input-output (HSIO) interface, a general purpose input-output (GPIO) interface, a multiplexer having a first input coupled to the GPIO interface, a test controller coupled between the HSIO interface and a second input of the multiplexer, and one or more processor cores coupled to the output of the multiplexer.

20 Claims, 5 Drawing Sheets

LOW PIN COUNT TEST CONTROLLER

TECHNICAL FIELD

The teachings of the present disclosure relate generally to testing systems, and more particularly, to a test controller.

INTRODUCTION

Processors are used extensively today in almost every electronic application. The processor controls the execution of program instructions, arithmetic functions, and access to memory and peripherals. In the simplest form, the processor executes program instructions by performing one or more arithmetic functions on data stored in memory.

BRIEF SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Certain aspects of the present disclosure are generally directed to circuitry for testing one or more processor cores.

Certain aspects provide an apparatus for processor core testing. The processor generally includes a high-speed input-output (HSIO) interface, a general purpose input-output (GPIO) interface, a multiplexer having a first input coupled to the GPIO interface, a test controller coupled between the HSIO interface and a second input of the multiplexer, and one or more processor cores coupled to an output of the multiplexer.

Certain aspects provide an apparatus for processor core testing. The processor generally includes a HSIO interface configured to generate a digital input for testing of one or more processor cores, and a test controller configured to receive the digital input from the HSIO interface, and control one or more operations for testing of one or more processor cores based on the digital input from the HSIO interface.

Certain aspects provide a method for processor core testing. The method generally includes selecting between one or more first digital inputs from a HSIO interface and one or more second digital inputs from a GPIO interface, receiving the selected one or more first or second digital inputs, and testing one or more processor cores via the selected one or more first or second digital inputs.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
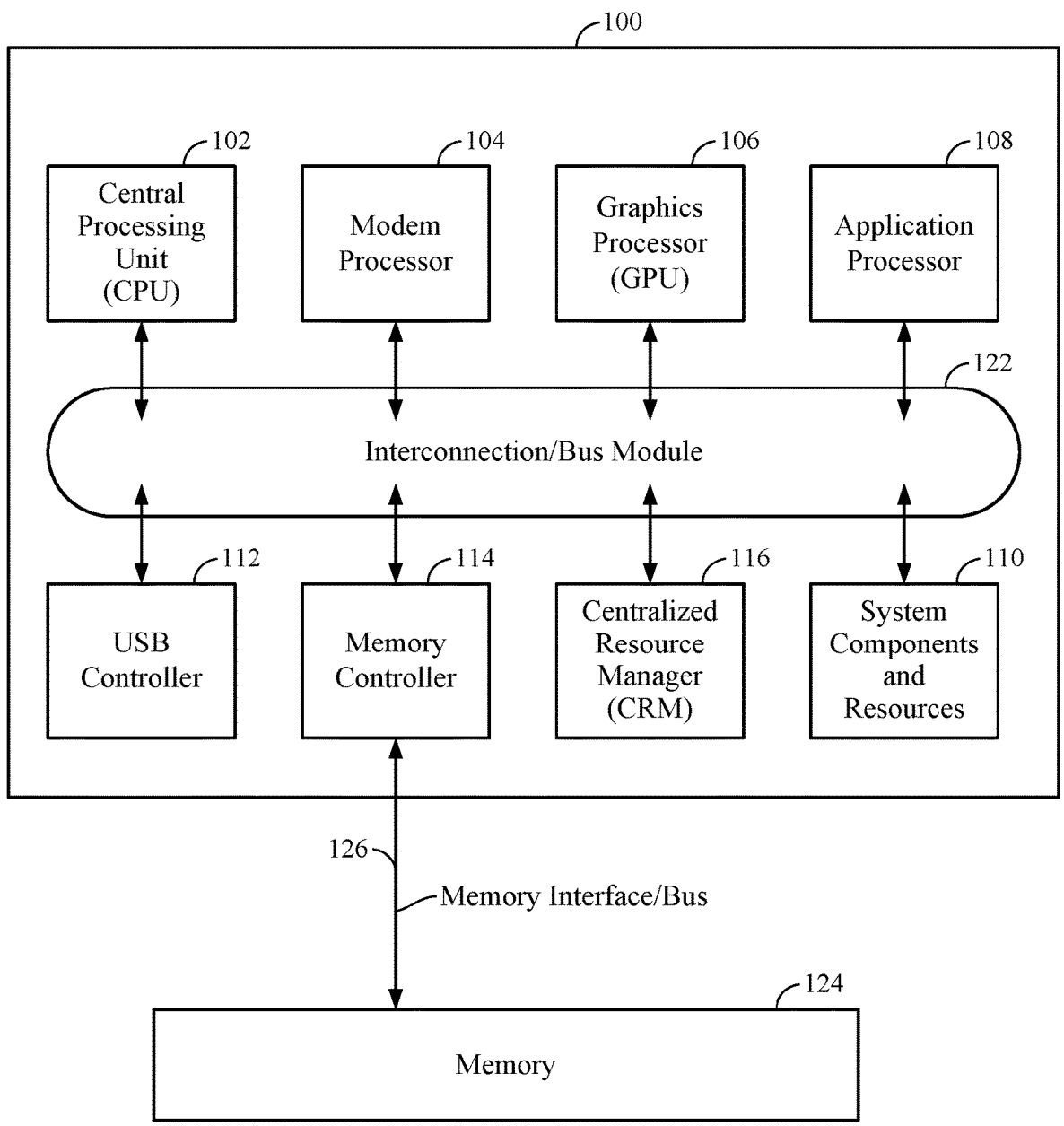
FIG. 1 is an illustration of an exemplary system-on-chip (SoC) integrated circuit design, in accordance with certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

The various aspects will be described in detail with reference to the accompanying drawings. Wherever possible, the same reference numbers will be used throughout the drawings to refer to the same or like parts. References made to particular examples and implementations are for illustrative purposes, and are not intended to limit the scope of the disclosure or the claims.

The terms "computing device" and "mobile device" are used interchangeably herein to refer to any one or all of servers, personal computers, smartphones, cellular telephones, tablet computers, laptop computers, netbooks, ultra-books, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., ROM, RAM, flash, etc.), and resources (e.g., timers, voltage regulators, oscillators, etc.), any or all of which may be included in one or more cores.

A number of different types of memories and memory technologies are available or contemplated in the future, all of which are suitable for use with the various aspects of the present disclosure. Such memory technologies/types include dynamic random-access memory (DRAM), static random-access memory (SRAM), non-volatile random-access memory (NVRAM), flash memory (e.g., embedded multi-media card (eMMC) flash), pseudostatic random-access memory (PSRAM), double data rate synchronous dynamic random-access memory (DDR SDRAM), and other random-access memory (RAM) and read-only memory (ROM) technologies known in the art. A DDR SDRAM memory may be a DDR type 1 SDRAM memory, DDR type 2 SDRAM memory, DDR type 3 SDRAM memory, or a DDR type 4 SDRAM memory. Each of the above-mentioned memory technologies includes, for example, elements suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

FIG. 1 illustrates example components and interconnections in a system-on-chip (SoC) 100 suitable for implementing various aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture (e.g., CoreConnect, AMBA, etc.). Communications may also be provided by advanced interconnects, such as high performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously.

The memory controller 114 may be a specialized hardware module configured to manage the flow of data to and from a memory 124 (e.g., a DRAM) via a memory interface/bus 126. Certain aspects of the present disclosure are generally directed to a memory implemented using negative capacitance material. For example, the memory 124 may be a DRAM implemented using negative capacitance material, improving the operation efficiency and/or reducing the size of the DRAM, as described in more detail herein.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

EXAMPLE LOW PIN COUNT TEST SYSTEM

Low Pin Count Test (LPCT) is a technique which reduces the cost of testing by reducing the pin requirements of a device when tested on an ATE. There are multiple scenarios that involve application of structural/ATE test patterns on a system. For example, debugging of customer fails may be necessary to rule out any defect induced failures, or to rule out defects on a part in the system. Functionality such as in-system test of devices that involve continuous monitoring of automotive products and remote debugging on a customer product using structural patterns are important.

Semiconductor system level testing (SLT) of scan patterns provide higher coverage at a lower test cost. However, ATE interfaces that apply these patterns may not be available on the system. Certain aspects of the present disclosure are directed to a controller that translates vectors delivered over existing functional interfaces (e.g., universal serial bus (USB), peripheral component interconnect express (PCIe), mobile industry processor interface (MIPI), joint test action group (JTAG)) to a format that may be applied to the device while it is socketed on the system. Structural test on SLT may move a significant portion of functional testing (FT) to SLT to reduce test-cost.

Figure 2:
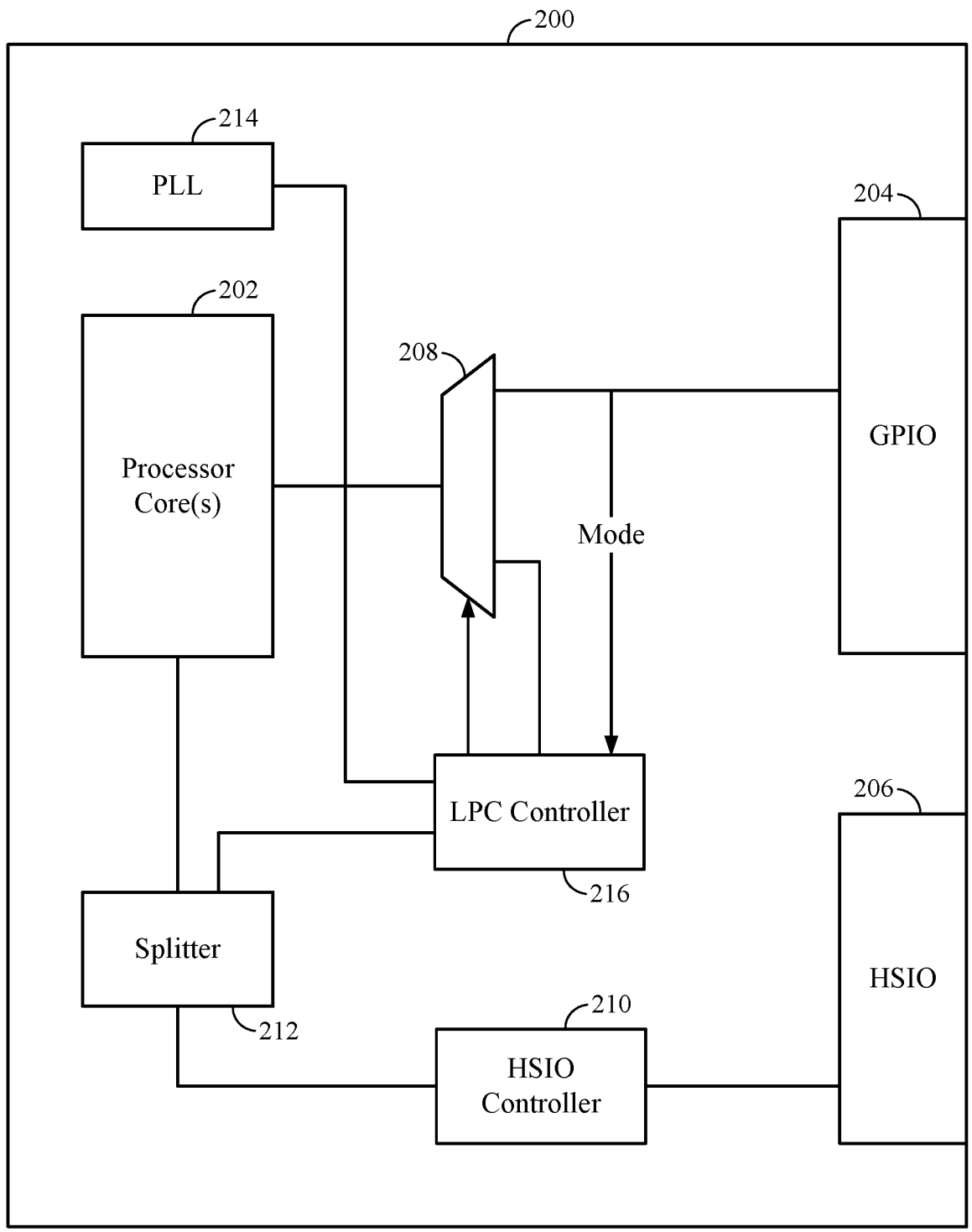
FIG. 2 illustrates a hardware architecture of an integrated circuit (IC) having processor core(s), in accordance with certain aspects of the present disclosure.

FIG. 2 illustrates a hardware architecture of an integrated circuit (IC) 200 having processor core(s) 202, in accordance with certain aspects of the present disclosure. The IC 200 may include an input/output (IO) interface for testing of the processor cores 202. For example, the IC 200 may include a general purpose IO (GPIO) interface 204 for the testing of the processor cores 202 (e.g., corresponding to the processors 102, 104, 106, 108).

Certain aspects of the present disclosure provide techniques and hardware architecture for performing testing using an HSIO (e.g., USB interface) interface. For example, the hardware architecture allows for selecting inputs from the GPIO interface 204 or a HSIO interface 206 for the testing of the processor cores 202. The IC 200 may include a multiplexer 208 that may be used to select inputs from the GPIO interface 204 or inputs from the HSIO interface 206 for the testing of the processor core 202.

As illustrated, the IC 200 may include an HSIO controller 210 (e.g., corresponding to the USB controller 112) for processing the input from the HSIO interface 206. For example, the output of the HSIO controller 210 may be provided to a splitter 212 which provides the input from the HSIO path to a low-pin count (LPC) controller 216 (also referred to herein as a test controller) and the processor cores 202.

The LPC controller 216 translates vectors delivered over via the HSIO controller 210 to a format that may be applied for the testing of the one or more processor cores. For example, the HSIO controller 210 may generate test signals for the testing of the processor cores 202 as translated based on the HSIO signal, and provides the test signals to the multiplexer 208, as illustrated. The multiplexer 208 allows for the selection of either inputs from the GPIO or the HSIO by the LPC controller 216. In certain aspects, the LPC controller 216 may receive a clock signal from a phase-locked loop (PLL) 214 for the generation of clocks and test signals, as will be described in more detail herein.

In certain aspects, a mode signal is received via the GPIO interface 204, indicating whether the IC 200 is in test mode. The mode signal is provided to the LPC controller 216, based on which the LPC controller 216 sets the control input to the multiplexer 208.

Figure 3:
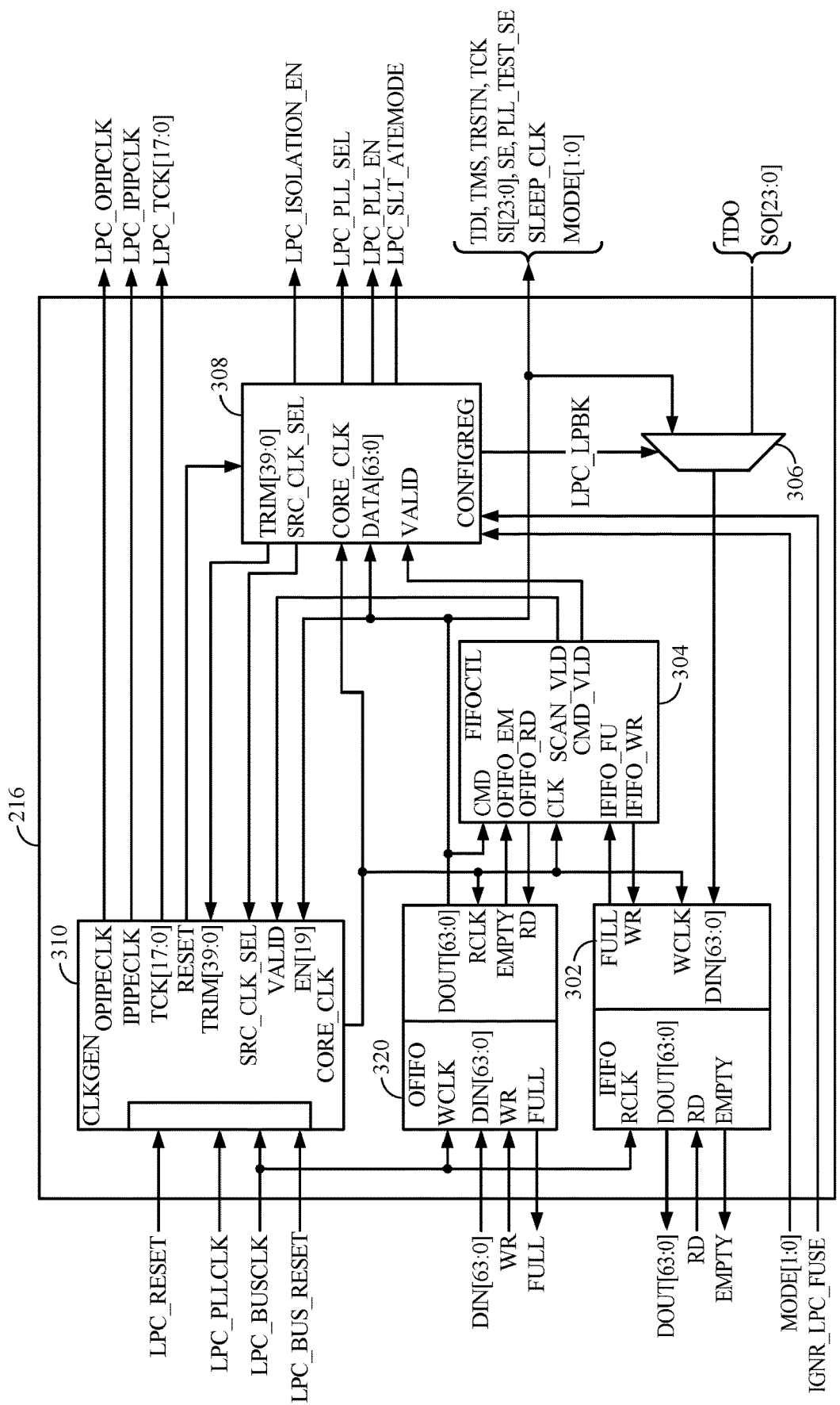
FIG. 3 illustrates an example implementation of a test controller, in accordance with certain aspects of the present disclosure.

FIG. 3 illustrates an example implementation of the LPC controller 216, in accordance with certain aspects of the present disclosure. The LPC controller 216 may provide a 64-bit data-in and data-out interface. The LPC controller 216 may be accessed through a first-in, first-out (FIFO) interface and convert FIFO data into a command, data, and clock interface to be used for accessing the test-interface and configuring the SOC for the testing of the processor cores.

The LPC controller 216 includes a clock generation module 310 for generating a test-interface clock and core clock for the testing of the processor cores 202. For example, the core clock may be provided to a read clock (RCLK) input of a output FIFO module 320, a write clock (WCLK) of the input FIFIO module 302, a clock (CLK) input of the FIFO control (FIFOCTL) module 304 (also referred to herein as a validation module), and a core clock (CORE_CLK) input of a configuration register (CONFIGREG) module 308, of the LPC controller 216, as illustrated. The output FIFO (OFIFO) module 320 (also referred to herein as a digital output interface) takes data from the HSIO controller 210 and provides the data to the test interface (e.g., through multiplexer 208 as described with respect to FIG. 1). The input FIFO (IFIFO) module 302 (also referred to herein as a digital input interface) reads data from test interface and provides the data to the HSIO controller 210.

The FIFOCTL module 304 generates signals (command valid (CMD_VALID), scan valid (SCAN_VALID)) indicating whether input data is a valid command or scan signal. The configuration register module 308 decodes command (CMD) inputs and programs configuration bits if the input data is a CMD signal, as described in more detail herein. For example, the IFIFO module may receive input data (DIN) having 64 bits. In certain aspects, the most significant bit of DIN (DATA[63]) indicates whether DIN is a CMD packet or data packet.

A CMD packet is used to control one or more testing operating modes for the testing of the processor cores. For example, the CMD packet may be used to control whether an isolation mode is enabled via an LPC_ISOLATION_EN signal generated by the configuration register module 308. If the isolation mode is turned enabled, the HSIO controller 210 and the splitter 212 are isolated from the LPC controller 216 such that the LPC controller 216 does not interfere with HSIO operations when testing is disabled.

The CMD packet may also be used for selecting and enabling a PLL (e.g., PLL 214) via respective LPC_PLL_SEL and LPC_PLL_EN signals generated by the configuration register module 308. In certain aspects, the CMD packet may be used to control whether a loopback mode is enabled via a LPC_LPBK signal generated by the configuration register module 308. In other words, a feedback loop may be implemented between a digital output of the OFIFO module 320 and the digital input of the IFIFO 302 via a multiplexer 306. The multiplexer 306 may be controlled via the LPC_LPBK signal for testing the LPC controller itself.

The CMD packet may also be used to control whether the SLT ATE mode is enabled via the LPC_SLT_ATE mode signal generated by the configuration register module 308. The LPC_SLT_ATE mode signal is used to control the multiplexer 208, as described herein.

In some cases, DATA[62] may indicate that DIN is a no-operation (NOP) CMD. DATA[61-0] may provide access to 62 configuration (CONFIG) bits of the LPC controller enabling different configuration settings such as controlling of the multiplexer 208 via an LPC_SLT_ATEMODE signal, or enabling a loop back mode (e.g., via multiplexer 306) for testing the LPC controller itself via a LPC_LPBK signal, as described herein. For example, each bit of DIN from bit 0 to bit 62 may be set to enable or disable a separate testing operation.

If DATA[63] indicates that that DIN is a DATA packet, DATA[62:0] are used as access to test-channels. Each of the bits DATA[62:0] may be mapped to a different GPIO such that testing that is otherwise performed via the GPIO interface may be controlled via HSIO interface. For example, data bits may support two kinds of signals, clock or data. Certain bits may be assigned for setting various clock signals such as a JTAG test clock (JTAG_TCK), test clock (TCLK), input PIPE clock (IPIPECLK), and output PIPE clock (OPIPECLK). In other words, if a logic high "1" is programmed to a bit corresponding to a clock signal, a pulse may be generated on the corresponding clock channel via the clock generation module 310, as described in more detail herein.

Other than clock signals, other bits are for data, meaning that if a 1 or 0 is programmed to a data bit, a 1 or 0 is generated at the corresponding channel. These channels may include test-data-in (TDI), test mode select (TMS), test reset negative asserted (TRSTN), test clock (TCK), scan input (SI), scan enable (SE), PLL test scan enable (PLL_TEST_SE), sleep clock (SLEEP_CLK), and mode select (MODE) channels for programming respective input of the SOC.

If a CMD packet is sent to the LPC controller 216, there may be no read-response from the LPC controller 216 to the HSIO controller 206. However, if a data packet is sent to the LPC controller 216, then for every write packet, the LPC controller 216 sends a response packet. For example, at the end of 1K byte write packet (e.g., 16 cycles of data), a read-channel may respond with 16 cycles of data.

Figure 4:
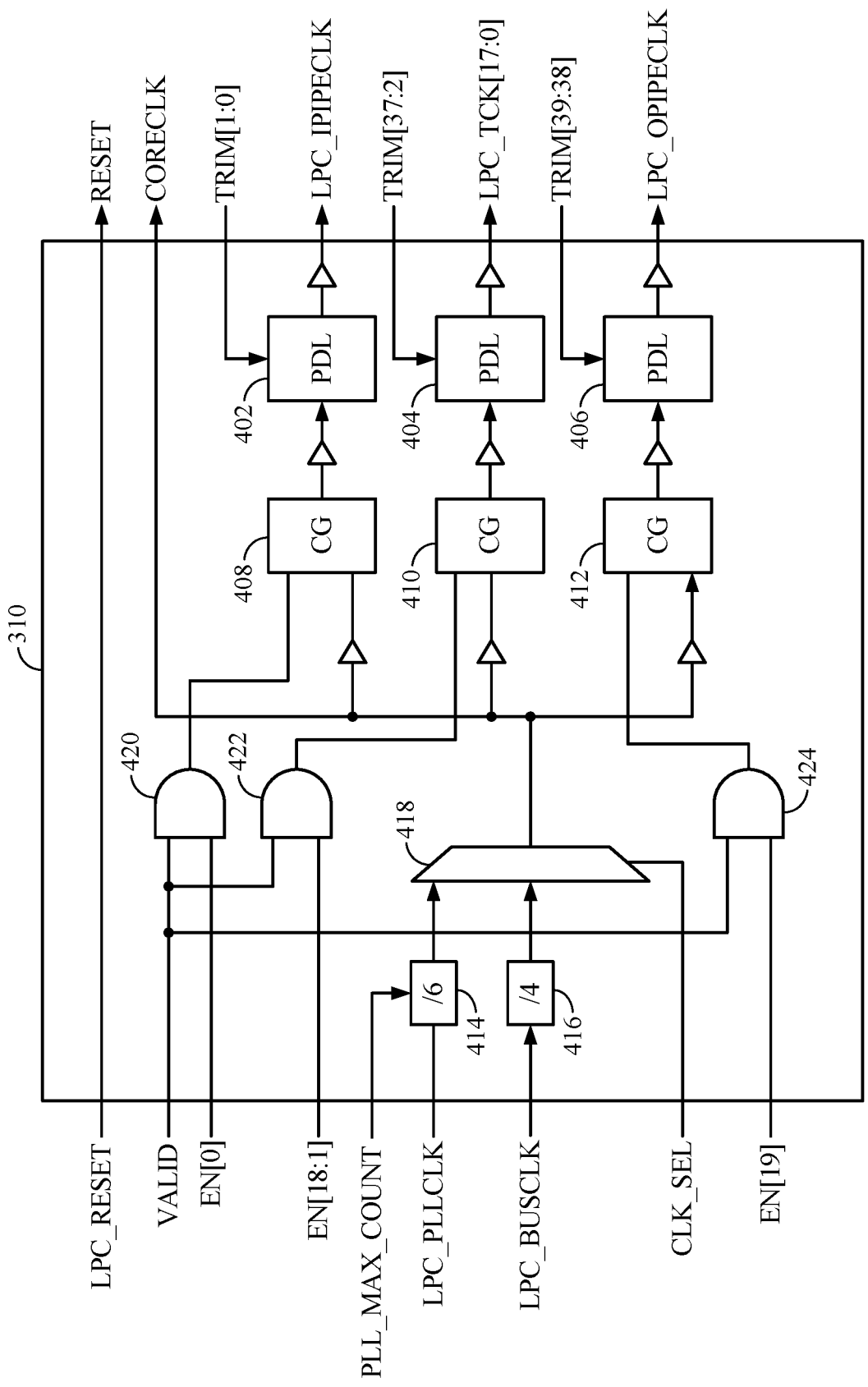
FIG. 4 is a block diagram illustrating an example implementation of a clock generation module, in accordance with certain aspects of the present disclosure.

FIG. 4 is a block diagram illustrating an example implementation of the clock generation module 310, in accordance with certain aspects of the present disclosure. As illustrated, the clock generation module 310 includes programmable delay elements 402, 404, 406 (PDLs) configured to apply different delays to input clock signals for skew adjustment and generation of clock signals, such as the LPC input PHY interface for PCI express (PIPE) clock (LPC_IPIPECLK), LPC test clock (LPC_TCK), and LPC output PIPE clock (LPC_OPIPECLK), each of which may be programmed via a trim input from the CONFIGREG module 308, as illustrated.

The PDLs 402, 404, 406 may be coupled to outputs of clock gate (CG) circuits 408, 410, 412, as illustrated. The clock gate circuits 408, 410, 412 provide respective input clocks to respective PDLs 402, 404, 406 if the output of respective AND gates 420, 422, 424 are logic high. Each of the AND gates 420, 422, 424 have an input coupled to a valid signal from the FIFOCTL module 304, indicating whether an input scan signal is valid, as will be described in more detail herein, as well as one or more enable signals (e.g., EN[0], EN[18:1], EN[19]), as illustrated.

The clock signals may be generated using input clock signals, such as an LPC PLL clock (LPC_PLLCLK) and an LPC BUS clock (LPC_BUSCLK). The LPC_PLLCLK may be generated from the PLL 214 and provided to the LPC controller 216 for generating a shift-frequency. The clock generation module 310 may include a programmable frequency divider 414 for reducing the frequency of the LPC_PLLCLK. A PLL maximum count (PLL_MAX_COUNT) configuration bit may be used to set a target shift speed.

The LPC_BUSCLK is sent by the HSIO controller 210 (e.g., USB controller) and controls the speed at which data may be read/written by the HSIO controller 210. The clock generation module 310 may include a fixed divide by four frequency divider 416 to generate a core clock (CORE_CLK) for the core-operation of the LPC controller 216. A multiplexer 418 may be used for selecting between the LPC_BUSCLK input path and the LPC_PLLCLK input path, as illustrated, via a clock select (CLK_SEL) signal. In certain aspects, the LPC controller 216 includes an ignore LPC controller (ignore_lpc_controller) input. If the ignore_lpc_controller input is programmed to 1, then the LPC controller 216 is disabled and cannot be accessed.

In certain aspects, the LPC controller 216 may have two resets. The LPC bus reset (LPC_BUS_RESET) input may be input from the HSIO controller 210 to reset the bus interface, and the LPC core reset (LPC_CORE_RESET) input provides the reset to the core logic of the LPC controller 216.

Figure 5:
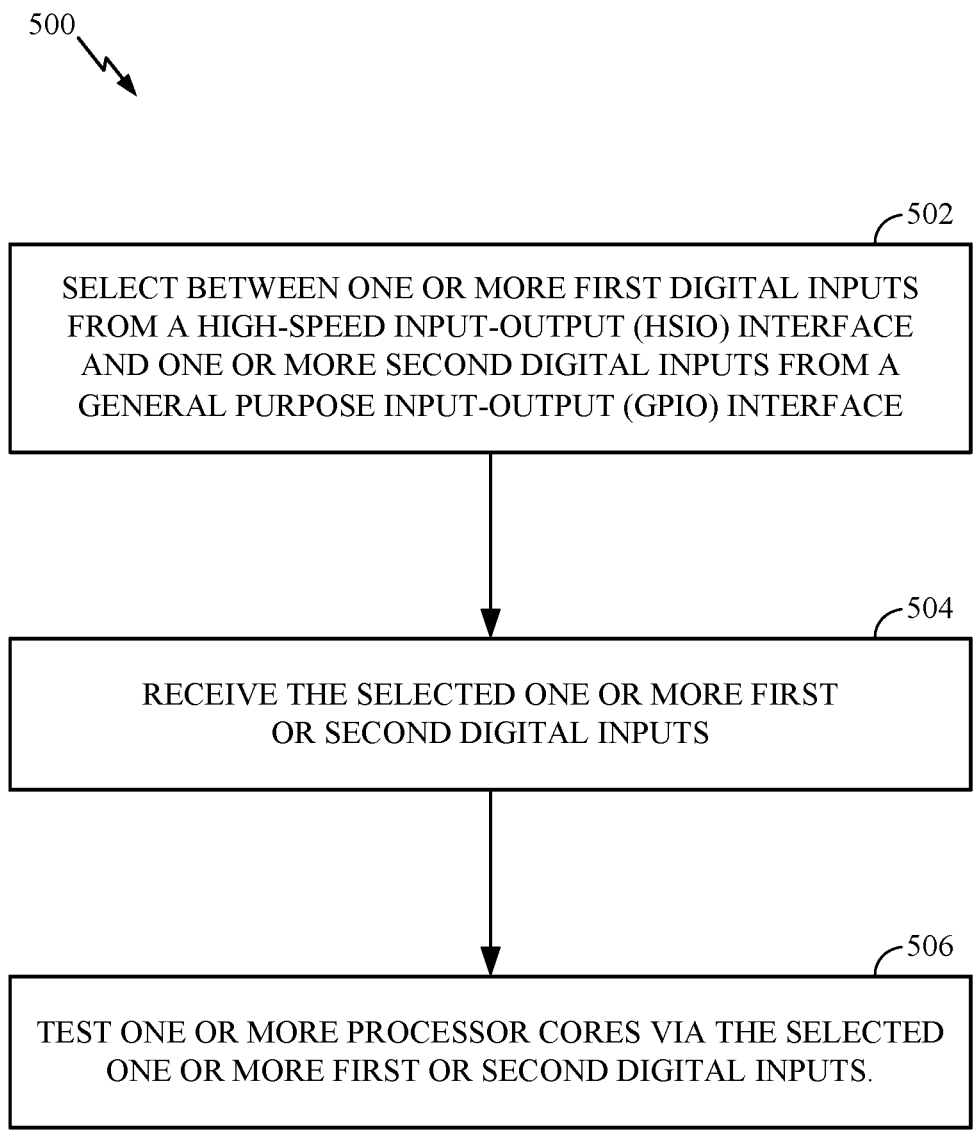
FIG. 5 is a flow diagram illustrating example operations for processor core testing, in accordance with certain aspects of the present disclosure.

FIG. 5 is a flow diagram illustrating example operations 500 for processor core testing, in accordance with certain aspects of the present disclosure. The operations 500 may be performed by an IC, such as the IC 200.

The operations 500 begin, at block 502, by selecting between one or more first digital inputs from a HSIO interface (e.g., HSIO interface 206) and one or more second digital inputs from a GPIO interface (e.g., GPIO interface 204). At block 504, the selected one or more first or second digital inputs is received, and at block 506, one or more processor cores are tested via the selected one or more first or second digital inputs. In certain aspects, the operations 500 may also include generating a repeated version (e.g., via splitter 212) of the one or more first digital inputs, and providing the repeated version of the one or more first digital inputs to the one or more processor cores.

In certain aspects, the operations 500 may also include determining (e.g., via the FIFOCTL module 304) whether the one or more first digital inputs is a command signal, and controlling (e.g., via the configuration register module 308) one or more operating modes for the testing of the one or more processor cores in response to the determination. In some cases, the operations 500 may also include determining (e.g., fvia the FIFOCTL module 304) whether the one or more first digital inputs is a scan signal, and generating one or more clock signals (e.g., via the clock generation module 310) for the testing of the one or more processor cores in response to the determination.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein. The algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. An apparatus for processor core testing, comprising:
a high-speed input-output (HSIO) interface;
a general purpose input-output (GPIO) interface;
a multiplexer having a first input coupled to the GPIO interface;
a test controller coupled between the HSIO interface and a second input of the multiplexer; and
one or more processor cores coupled to an output of the multiplexer.

2. The apparatus of claim 1, further comprising an HSIO controller coupled between the HSIO interface and the test controller.

3. The apparatus of claim 2, wherein the test controller further comprises a splitter having an input coupled to the HSIO controller, a first output coupled to the one or more processor cores, and a second output coupled to the test controller.

4. The apparatus of claim 1, wherein the HSIO interface comprises a universal serial bus (USB) interface.

5. The apparatus of claim 1, wherein the test controller comprises a clock generation module configured to generate one or more clock signals for testing of the one or more processor cores based on one or more input clock signals.

6. The apparatus of claim 5, wherein the one or more input clock signals comprise a first clock signal and a second clock signal, the HSIO being configured to generate the first clock signal, wherein the apparatus further comprises a phase-locked loop (PLL) configured to generate the second clock signal.

7. The apparatus of claim 6, wherein the clock generation module comprises:
another multiplexer having inputs configured to obtain the first and second clock signals; and
one or more programmable delay elements coupled to the output of the multiplexer.

8. The apparatus of claim 1, wherein the test controller further comprises a configuration register module configured to control one or more operating modes for testing the one or more processor cores based on a digital input from the HSIO interface.

9. The apparatus of claim 8, wherein:
the test controller further comprises a validation module configured to determine whether the digital input is a command signal, and provide an indication of whether the digital input is the command signal to the configuration register module; and
the configuration register module is configured to control the one or more operating modes if the digital input is the command signal.

10. The apparatus of claim 9, wherein a bit of the digital input indicates whether digital input is the command signal.

11. The apparatus of claim 9, wherein:
the test controller comprises a clock generation module configured to generate one or more clock signals for testing of the one or more processor cores;
the validation module is further configured to determine whether the digital input is a scan signal, and provide another indication of whether the digital input is the scan signal to the clock generation module; and
the clock generation module is configured to generate the one or more clock signals for the testing of the one or more processor cores in response to the other indication.

12. The apparatus of claim 1, further comprising an HSIO controller coupled between the HSIO interface and the test controller, wherein the test controller comprises:
a digital input interface configured to receive a digital input from the HSIO controller for testing the one or more processor cores; and
a digital output interface configured to receive a digital output from the one or more processor cores and provide the digital output to the HSIO controller.

13. The apparatus of claim 12, wherein the test controller comprises a feedback loop between an output of the digital input interface and an input of the digital output interface.

14. The apparatus of claim 13, wherein the feedback loop comprises another multiplexer having:
a first input configured to receive the digital output from the one or more processor cores; and
a second input configured to receive the digital input from the digital input interface.

15. An apparatus for processor core testing, comprising:
a high-speed input-output (HSIO) interface configured to generate a digital input for testing of one or more processor cores; and
a test controller configured to:
receive the digital input from the HSIO interface; and
control one or more operations for testing of one or more processor cores based on the digital input from the HSIO interface.

16. A method for processor core testing, comprising:
selecting between one or more first digital inputs from a high-speed input-output (HSIO) interface and one or more second digital inputs from a general purpose input-output (GPIO) interface;
receiving the selected one or more first or second digital inputs; and
testing one or more processor cores via the selected one or more first or second digital inputs.

17. The method of claim 16, further comprising:
generating a repeated version of the one or more first digital inputs; and providing the repeated version of the one or more first digital inputs to the one or more processor cores.

18. The method of claim 16, wherein the HSIO interface comprises a universal serial bus (USB) interface.

19. The method of claim 16, further comprising:
determining whether the one or more first digital inputs is a command signal; and
controlling one or more operating modes for the testing of the one or more processor cores in response to the determination.

20. The method of claim 16, further comprising:
determining whether the one or more first digital inputs is a scan signal; and
generating one or more clock signals for the testing of the one or more processor cores in response to the determination.

* * * * *